United States Patent
Miya (10) Patent No.: US 8,212,632 B2
(45) Date of Patent: Jul. 3, 2012

(54) FET PHASE SHIFTER FOR SELECTIVELY PHASE SHIFTING SIGNALS BETWEEN DIFFERENT FILTERING CHARACTERISTICS

(75) Inventor: Tatsuya Miya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 239 days.

(21) Appl. No.: 12/608,656

(22) Filed: Oct. 29, 2009

(65) Prior Publication Data

US 2010/0117758 A1    May 13, 2010

(30) Foreign Application Priority Data

Nov. 7, 2008   (JP) ................................. 2008-286304

(51) Int. Cl.
*H01P 1/18* (2006.01)
(52) U.S. Cl. ....................................... 333/164; 333/139
(58) Field of Classification Search .................. 333/164, 333/139, 156
See application file for complete search history.

(56) References Cited

U.S. PATENT DOCUMENTS

| 4,963,773 | A | 10/1990 | Ayasli | |
|---|---|---|---|---|
| 7,123,116 | B2 * | 10/2006 | Hieda et al. | 333/164 |
| 2007/0273456 | A1 * | 11/2007 | Miyaguchi et al. | 333/103 |

FOREIGN PATENT DOCUMENTS

| JP | 07-33026 | 6/1995 |
|---|---|---|
| JP | 8-213868 | 8/1996 |
| JP | 2001-326558 | 11/2001 |
| JP | 2001-339276 | 12/2001 |

OTHER PUBLICATIONS

Campbell et al., A Compact 5-Bit Phase-Shifter MMIC for K-Band Satellite Communication Systems, IEEE Transaction on Microwave Theory and Techniques, p. 2652, vol. 48, No. 12, Dec . 2000.

* cited by examiner

*Primary Examiner* — Benny Lee
(74) *Attorney, Agent, or Firm* — Young & Thompson (57) ABSTRACT

Provided is a phase shifter that shifts a phase of an input signal based on switching between a low-pass filter and a high-pass filter, the phase shifter including: a first field-effect transistor that is coupled between an input terminal and an output terminal; a resonance circuit that resonates when the first field-effect transistor is in an on-state; an additional line that is coupled between the resonance circuit and a node that is included in a signal line, which is formed between the input and output terminals when the first field-effect transistor is in the on-state; and an inductor that is included in a part of the signal line and forms a low-pass filter together with at least the additional line, when the first field-effect transistor is in the on-state.

7 Claims, 14 Drawing Sheets

| SELECTED FILTER | LPF | HPF |
|---|---|---|
| FET5 | ON | OFF |
| FET7 | OFF | ON |

FET PHASE SHIFTER FOR SELECTIVELY PHASE SHIFTING SIGNALS BETWEEN DIFFERENT FILTERING CHARACTERISTICS

BACKGROUND

1. Field of the Invention

The present invention relates to a phase shifter, and more particularly, to a phase shifter that shifts a phase of a signal waveform based on switching between filters having different characteristics.

2. Description of Related Art

In general, phase shifters are necessary for communications using phased array technology and the like. Each phase shifter for shifting the phase of an input signal is required to have a high phase shift accuracy to shift the phase of the input signal. In order to achieve the high phase shift accuracy during normal use, it is necessary to reduce an input/output reflection coefficient (i.e., to improve an input/output return loss). Note that the phase shifter is also required to have a smaller passage loss.

As an example of the phase shifter using a field-effect transistor (hereinafter referred to as "FET"), switching phase shifters for obtaining a phase difference by using a switch (hereinafter also abbreviated as "SW") to switch between a high-pass filter (HPF) and a low-pass filter (LPF) are widely employed.

"The phase shifters of this type have a problem of a great loss in the SW unit. In view of this, an embedded phase shifter for shifting a phase without using the SW has been studied and proposed in order to reduce the loss (see Japanese Unexamined Utility Model Application Publication No. 07-33026 (hereinafter referred to as "Patent Document 1"), U.S. Pat. No. 4,963,773 (hereinafter referred to as "Patent Document 2"), Japanese Unexamined Patent Application Publication No. 2001-339276(hereinafter referred to as "Patent Document 3"), Japanese Unexamined Patent Application Publication No. 2001-326558 (hereinafter referred to as "Patent Document 4"), Japanese Unexamined Patent Application Publication No. 08-213868 (hereinafter referred to as "Patent Document 5"), "IEEE TRANSACTION ON MICROWAVE THEORY AND TECHNIQUES", p. 2652, Vol. 48, No. 12, Dec. 2000 (hereinafter referred to as "Non-patent Document 1"), and "Microwave and Millimeter Wave Phase Shifters", Volume II, p. 411 (hereinafter referred to as "Non-patent Document 2"))."

The phase shifter disclosed in Patent Document 1 switches the gate voltages of FETs, which allows the circuit itself to switch between the LPF and the HPF. The phase shifter switches between the HPF and the LPF, thereby shifting the phase of the input signal.

Patent Document 2 also discloses a phase shifter that switches the gate voltages of FETs, which allows the circuit itself to switch between the LPF and the HPF.

Referring now to FIGS. 10 11, 12A, 12B, 12C, 13A, 13B, and 13C, the phase shifter disclosed in Non-patent Document 1 will be described.

Figure 10:
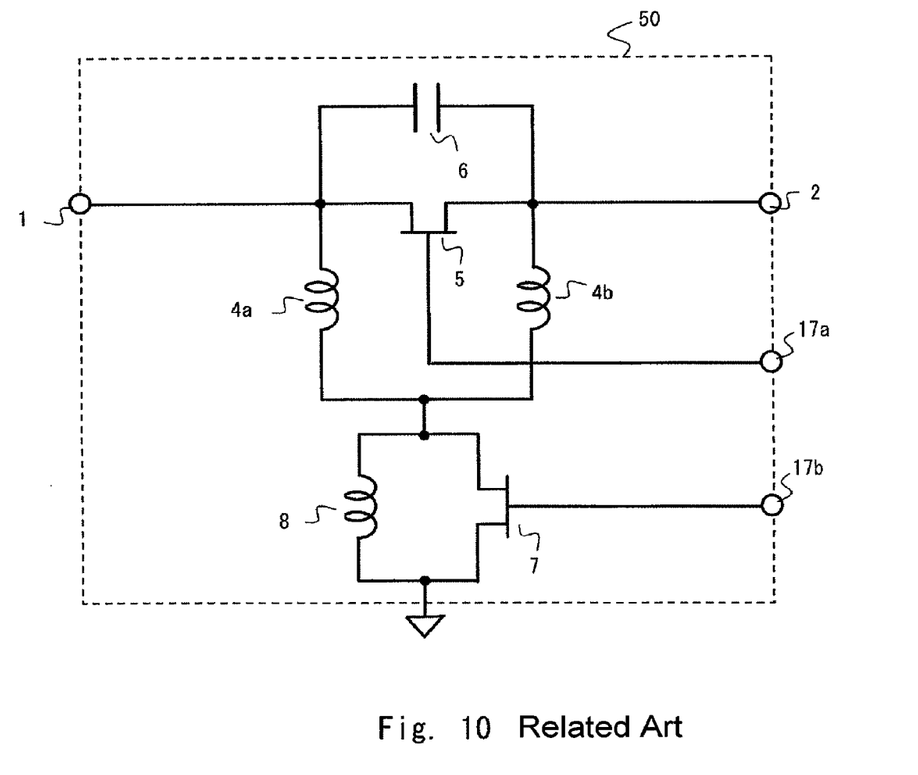
FIG. 10 is a schematic circuit diagram showing a phase shifter of the related art.

As shown in FIG. 10, a phase shifter 50 includes inductors 4a and 4b, an FET 5, a capacitor 6, an FET 7, and an inductor 8.

The inductors 4a and 4b are sequentially connected in series between an input terminal 1 and an output terminal 2. The FET 5 forms a bypass between the inductors 4a and 4b. The capacitor 6 is connected between the drain and source of the FET 5. The FET 7 is connected between a node between the inductors 4a and 4b and a ground. The inductor 8 is connected between the drain and source of the FET 7.

The control terminals of the FETs 5 and 7 receive complementary control voltages from the respective terminals 17a and 17b, and the FETs 5 and 7 operate complementarily. Specifically, when the FET 5 is in an on-state, the FET 7 is in an off-state. When the FET 7 is in the on-state, the FET 5 is in the off-state.

Figure 11:
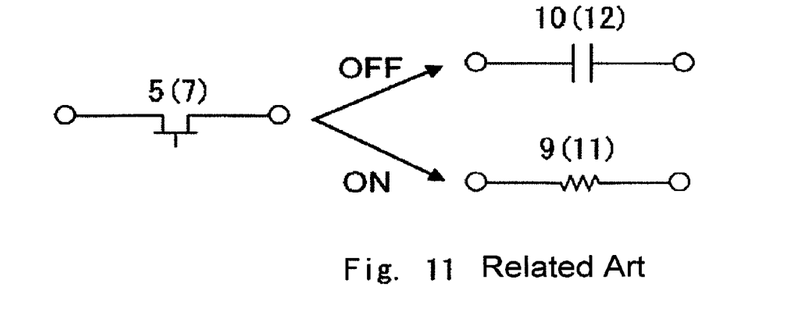
FIG. 11 is an explanatory diagram showing an FET.

Note that the impedance of the FET which is in the on-state is equivalent to a small resistance, and the impedance of the FET which is in the off-state is equivalent to a small capacitance. Specifically, as shown in FIG. 11, the FET 5 which is in the on-state can be replaced with a small resistance 9, and the FET 5 which is in the off-state can be replaced with an OFF capacitance 10. Likewise, the FET 7 which is in the on-state can be replaced with a small resistance 11, and the FET 7 which is in the off-state can be replaced with an OFF capacitance 12.

Consideration is first given to the case where the FET 5 is in the on-state and the FET 7 is in the off-state. The phase shifter 50 shown in FIG. 10 can be depicted as FIG. 12A. Please note that in each drawing, the same numerals are given to the same components.

Assuming that the inductance of the inductor 8 is represented by L3 and the capacitance value of the OFF capacitance 12 is represented by Coff2, when the inductance L3 is set so as to satisfy the condition $\omega^2 L3 \text{Coff}2 = 1$, the inductor 8 and the FET 7 are in parallel resonance. Accordingly, the phase shifter shown in FIG. 12A can be depicted as FIG. 12B. Since the resistance 9 is a small resistance, the input/output terminals 1/2 are substantially short-circuited. As a result, the circuit shown in FIG. 12B can be replaced with the circuit shown in FIG. 12C.

Next, consideration is given to the case where the FET 5 is in the off-state and the FET 7 is in the on-state. The phase shifter shown in FIG. 10 can be depicted as FIG. 13A.

Figure 13A:
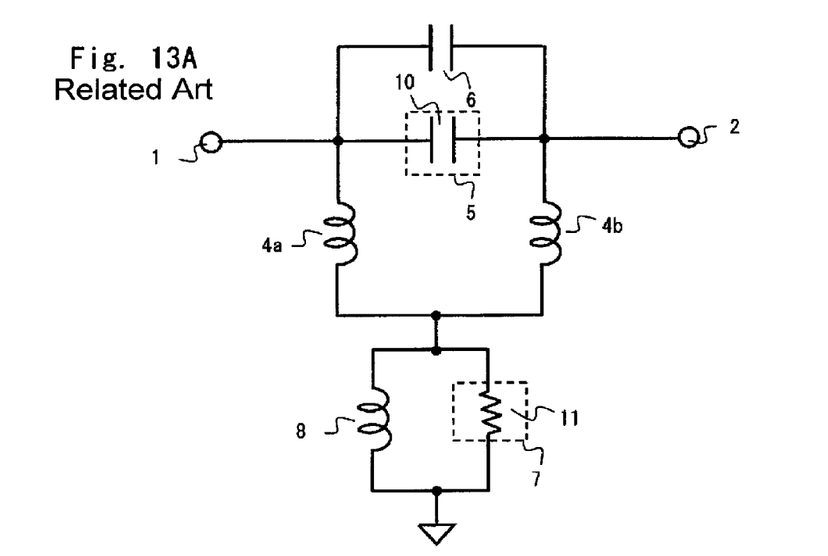
FIGS. 13A to 13C are schematic circuit diagrams illustrating operation of the phase shifter of the related art.
Figure 13B:
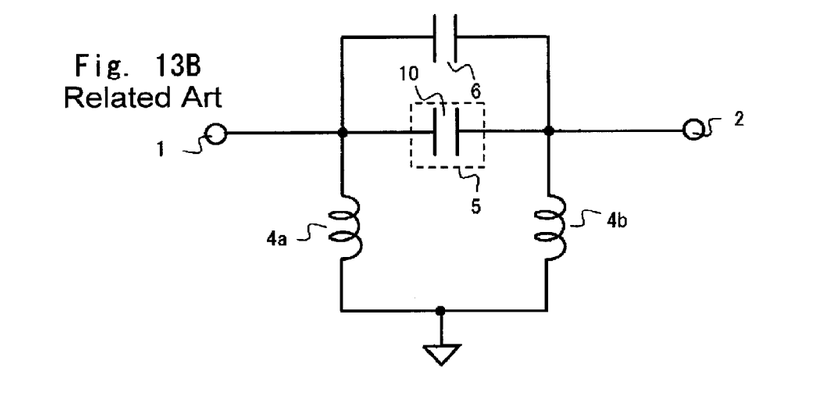
Figure 13C:
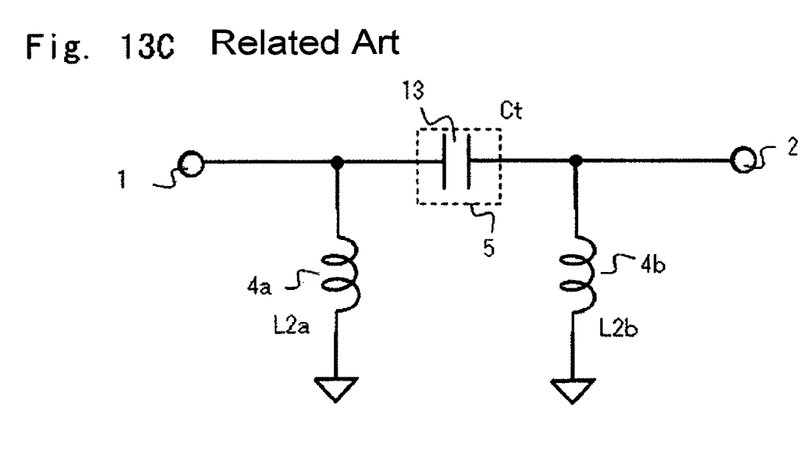

Since the resistance 11 is a small resistance, the phase shifter shown in FIG. 13A can be depicted as FIG. 13B. Further, assuming that the composite capacitance of the OFF capacitance 10 and the capacitor 6 corresponds to a capacitance 13, the phase shifter shown in FIG. 13B can be depicted as FIG. 13C.

Assuming that the inductance of the inductor 4a is represented by L2a; the inductance of the inductor 4b is represented by L2b; and the capacitance of the composite capacitance 13 is represented by Ct, each constant is set so as to satisfy L2a=L2b, Bn=2Xn/(1+Xn²)[where Bn represents an admittance due to the L2a, and Xn represents an impedance due to. As a result, the circuit shown in FIG. 13C functions as the HPF matched with a characteristic impedance. The phase of an output signal of the phase shifter shown in FIG. 13C advances by $\Phi=2\arctan(\omega L2a)$ relative to the phase of an output signal of the phase shifter shown in FIG. 12C (see Non-patent Document 2). Thus, it is possible to configure the phase shifter capable of switching the passing phase by alternately switching the gate biases of the FETs 5 and 7.

Each of the inductors 4a and 4b is generally formed by a line which has a spiral structure or the like and formed on a semiconductor substrate, i.e., a distributed constant circuit.

Figure 12A:
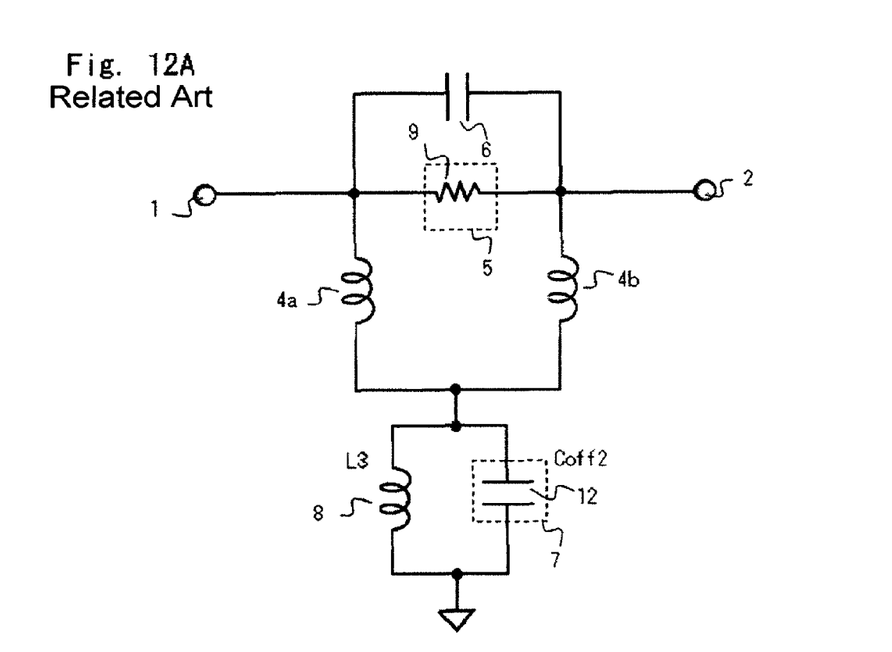
FIGS. 12A to 12C are schematic circuit diagrams illustrating operation of the phase shifter of the related art.
Figure 12B:
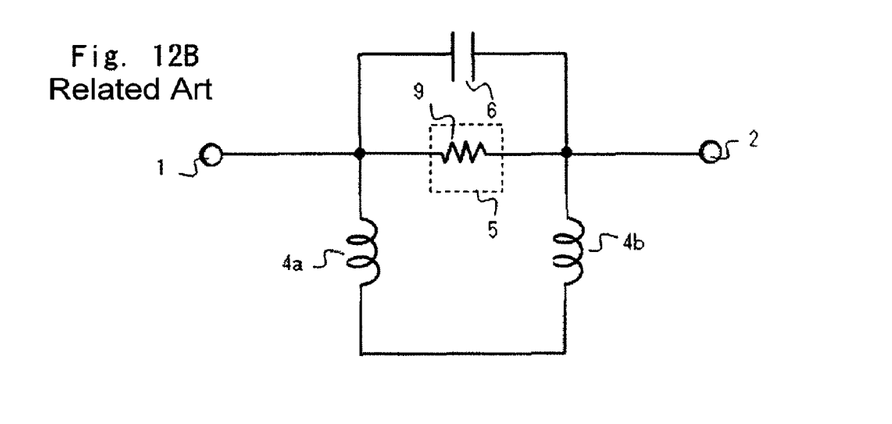
Figure 12C:
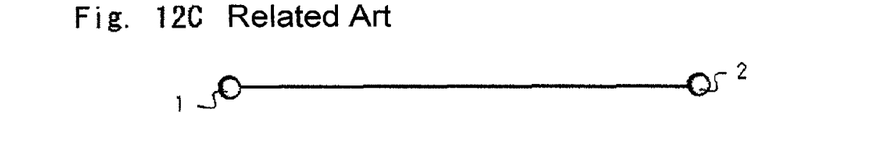
Figure 14A:
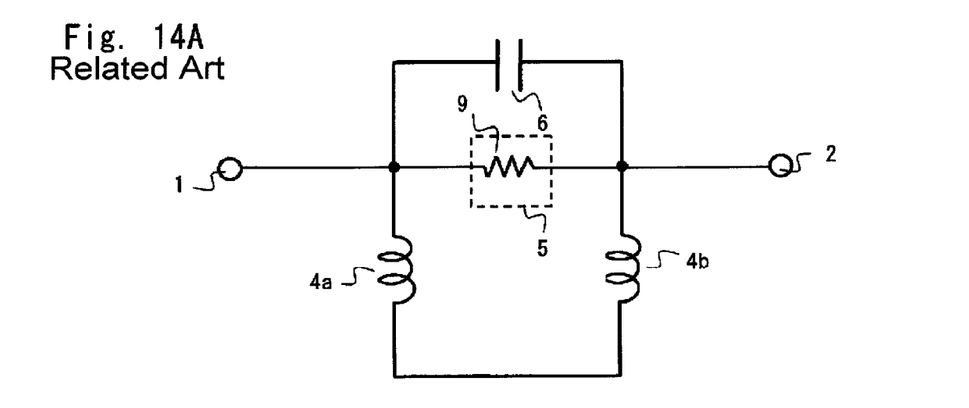
FIGS. 14A to 14D are schematic circuit diagrams illustrating a problem found by the present inventor.
Figure 14B:
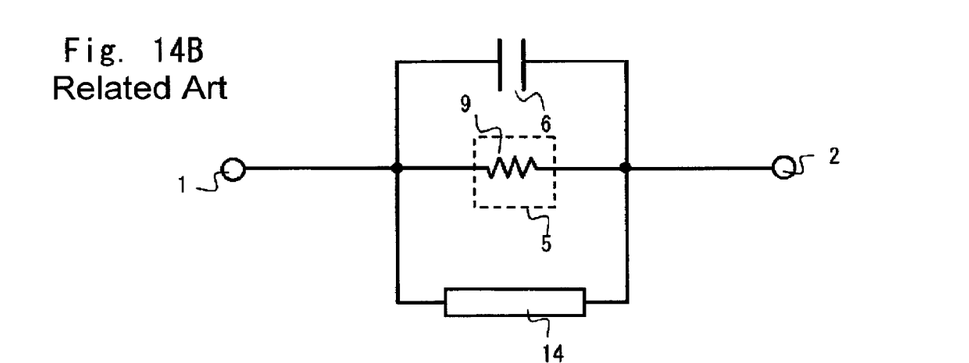
Figure 14C:
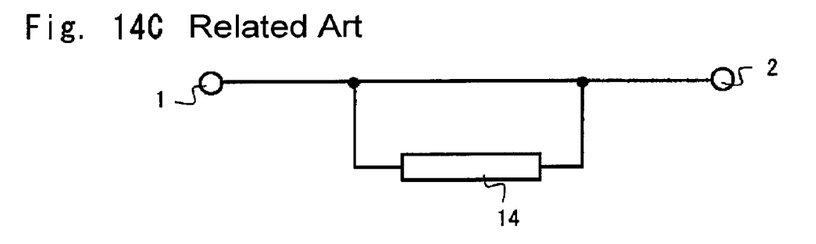

As described above, the phase shifter shown in FIG. 12B can be depicted as FIG. 12C. However, the present inventor studied and revealed that a line 14 constituting the inductors 4a and 4b is left. That is, the phase shifter shown in FIG. 14A can be depicted as FIG. 14b . If the small resistance 9 is ignored, the phase shifter shown in FIG. 14B can be depicted as FIG. 14C. Further, the line 14 shown in FIG. 14C can be replaced with two open stubs 15a and 15b as shown in FIG. 14D.

When the line 14 has an impedance Z1 and an angle θ1, each of the open stubs 15a and 15b has the impedance Z1 and an angle θ/2 (see Patent Document 5).

The magnitude of each of the inductors 4a and 4b varies depending on a desired shift amount. When a 45-degree phase shifter operating at 12 GHz is designed using a GaAs substrate having a dielectric constant of about 13 and a thickness of 50μ as a semiconductor substrate, the inductor 4a has an inductance of about 1.5 nH. When the inductor 4a is formed into a spiral structure, it is proved by simulation that the inductor 4a is substantially equivalent to a line of about 1 to 2 mm. In this case, each of the open stubs 15a and 15b has a length of about 0.5 to 1 mm. Because a wavelength λ at 12 GHz is about 7.5 mm on the GaAs substrate, it is apparent that each of the open stubs 15a and 15b having a length of λ/4 or smaller functions as a capacitance and has a capacitance of about 0.1 to 0.3 PF.

Figure 14D:
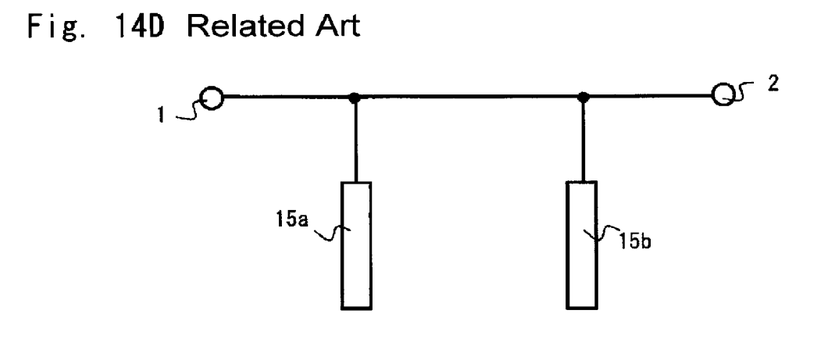

Accordingly, in the case of the circuit shown in FIG. 14D, a capacitance of about 0.3 PF is grounded in parallel with a signal line. This results in lowering the impedance. In other words, when the FET 5 connected in series with the signal line is in the on-state and the FET 7 connected in parallel with the signal line is in the off-state, the return loss is degraded and the passage loss increases.

SUMMARY OF THE INVENTION

The present inventor has found a problem that the characteristics (e.g., return loss and passage loss) of a phase shifter may be degraded by a line (open stub) which is unintentionally added to a signal line.

A first exemplary aspect of the present invention is a phase shifter that shifts a phase of an input signal based on switching between a low-pass filter and a high-pass filter, the phase shifter including: a first field-effect transistor that is coupled between an input terminal and an output terminal; a resonance circuit that resonates when the first field-effect transistor is in an on-state; an additional line that is coupled between the resonance circuit and a node that is included in a signal line, which is formed between the input and output terminals when the first field-effect transistor is in the on-state; and an inductor that is included in a part of the signal line and forms a low-pass filter together with at least the additional line, when the first field-effect transistor is in the on-state.

When the first field-effect transistor is in the on-state, the inductor that forms the low-pass filter together with the additional line is placed in the signal line. A matched low-pass filter is formed using the additional line and the inductor. As a result, the characteristics of the phase shifter can be prevented from being degraded by the additional line that is unintentionally connected.

A second exemplary aspect of the present invention is a phase shifter including: a first inductor and a second inductor that are coupled in series between an input terminal and an output terminal; a first field-effect transistor that forms a bypass between the first inductor and the second inductor; a resonance circuit that is coupled to a node between the first inductor and the second inductor; a third inductor that is coupled between the input terminal and the first inductor; and a fourth inductor that is coupled between the second inductor and the output terminal.

Even if the additional line is unintentionally connected to the signal line when the first field-effect transistor is in the on-state, the combination of the additional line and the third inductor as well as the combination of the additional line and the fourth inductor forms a matched low-pass filter. As a result, the characteristics of the phase shifter can be prevented from being degraded by the additional line.

BRIEF DESCRIPTION OF THE DRAWINGS

"The above and other exemplary aspects, advantages and features will be more apparent from the following description of certain exemplary embodiments taken in conjunction with the accompanying drawings, in which like features are denoted by the same reference label throughout the different drawing figures. In the drawings:"

DETAILED DESCRIPTION OF THE EXEMPLARY EMBODIMENTS

[First Exemplary Embodiment]

Figure 1:
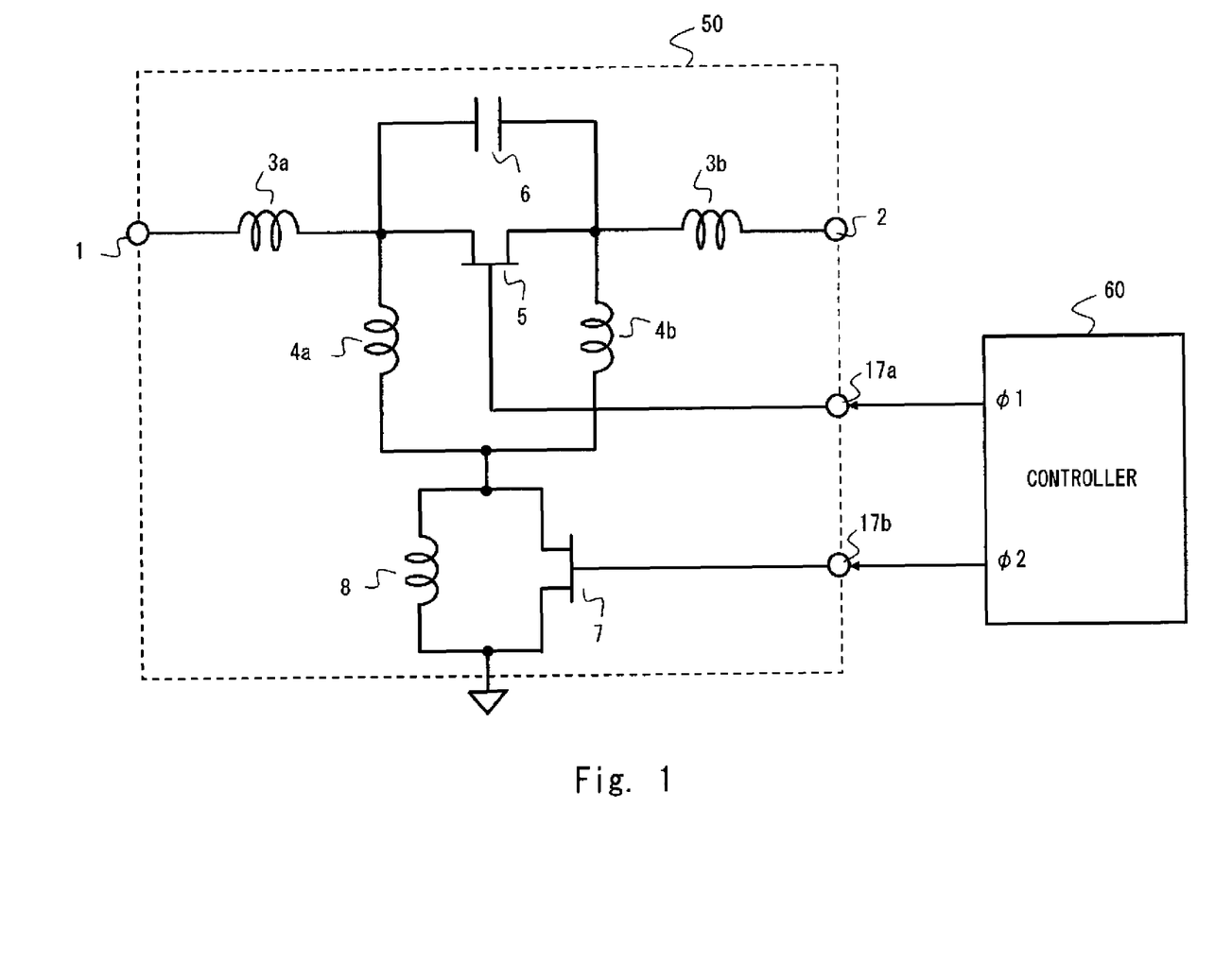
FIG. 1 is a schematic circuit diagram showing a phase shifter according to a first exemplary embodiment of the present invention.
Figure 2:
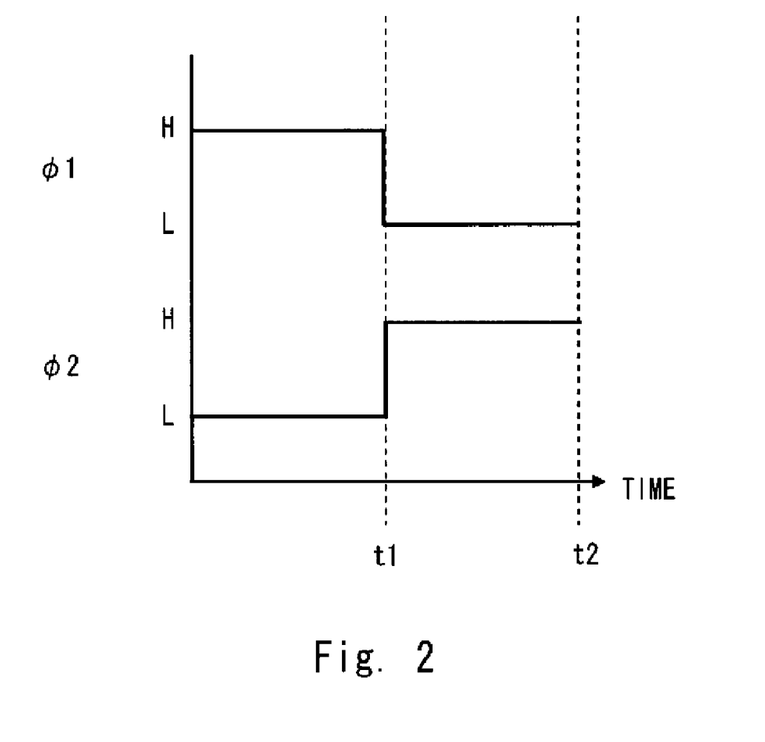
FIG. 2 is a schematic waveform chart showing control signals according to the first exemplary embodiment of the present invention.
Figure 3:
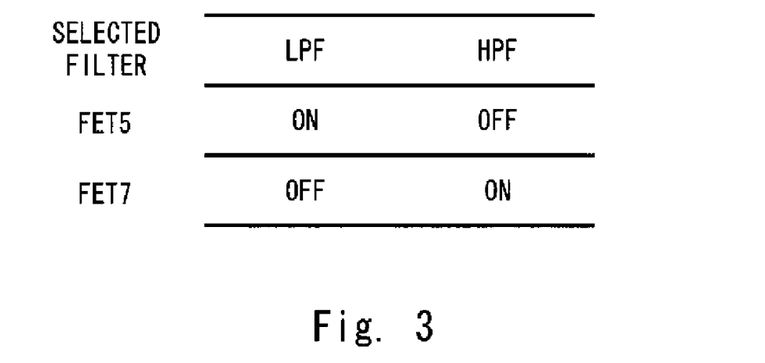
FIG. 3 is an explanatory diagram showing the relation between a selected filter and operating states of FETs according to the first exemplary embodiment of the present invention.
Figure 4:
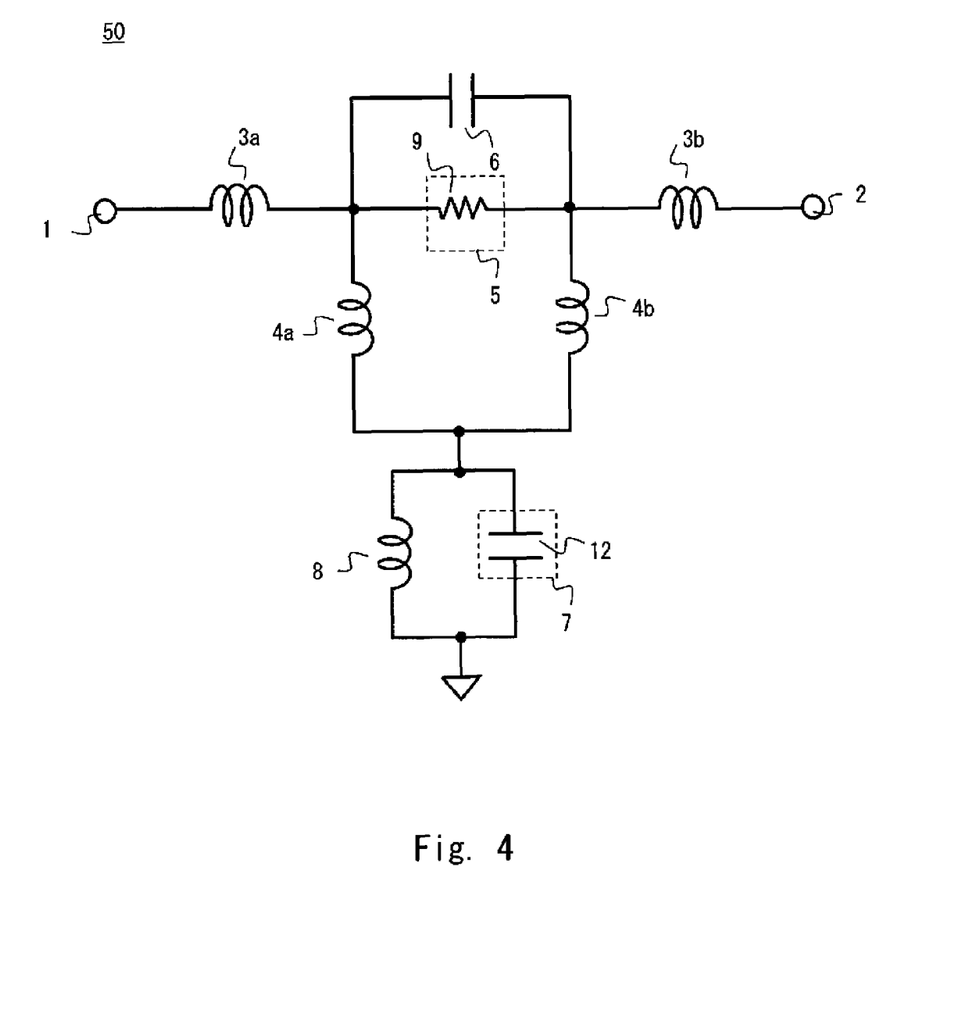
FIG. 4 is a circuit diagram showing a phase shifter functioning as an LPF according to the first exemplary embodiment of the present invention.
Figure 5A:
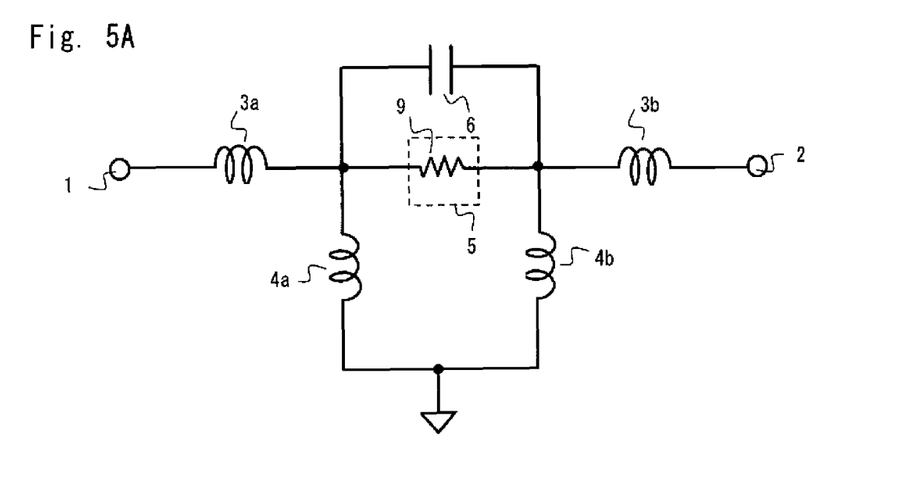
FIGS. 5A to, 5B, and 5C are equivalent circuit diagrams of FIG. 4 according to the first exemplary embodiment of the present invention.
Figure 5B:
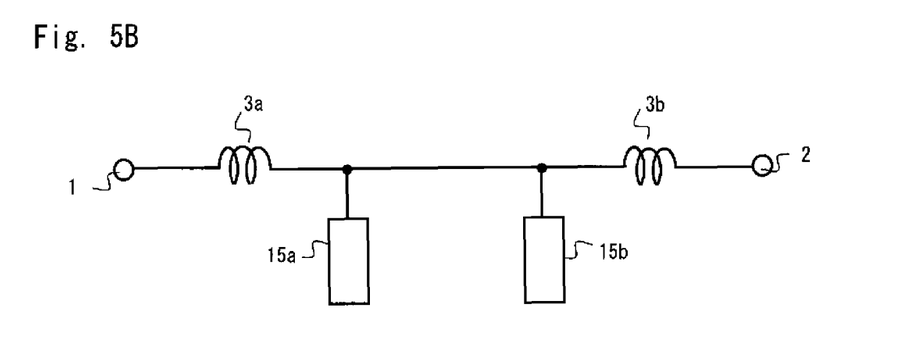
Figure 5C:
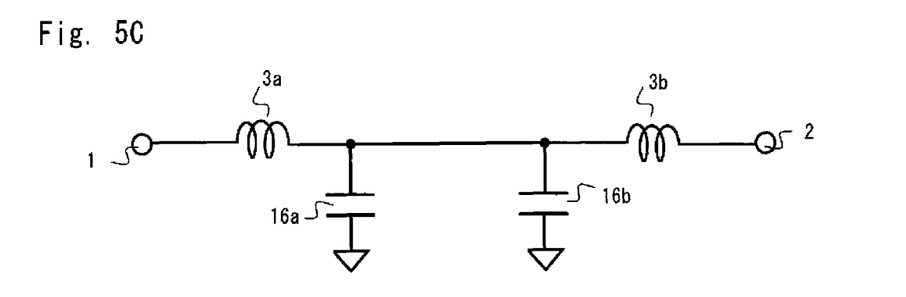
Figure 6:
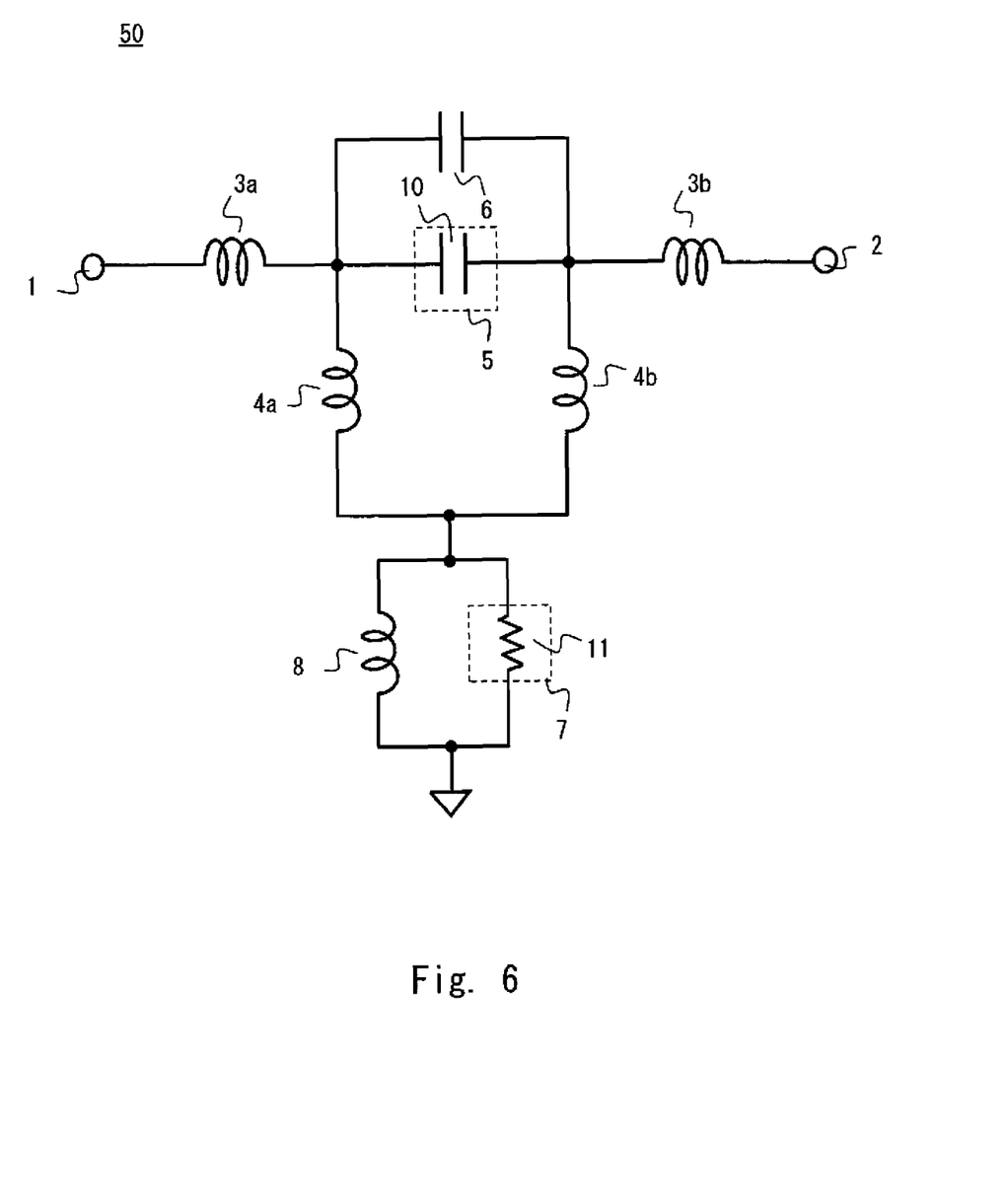
FIG. 6 is a circuit diagram showing a phase shifter functioning as an HPF according to the first exemplary embodiment of the present invention.
Figure 7A:
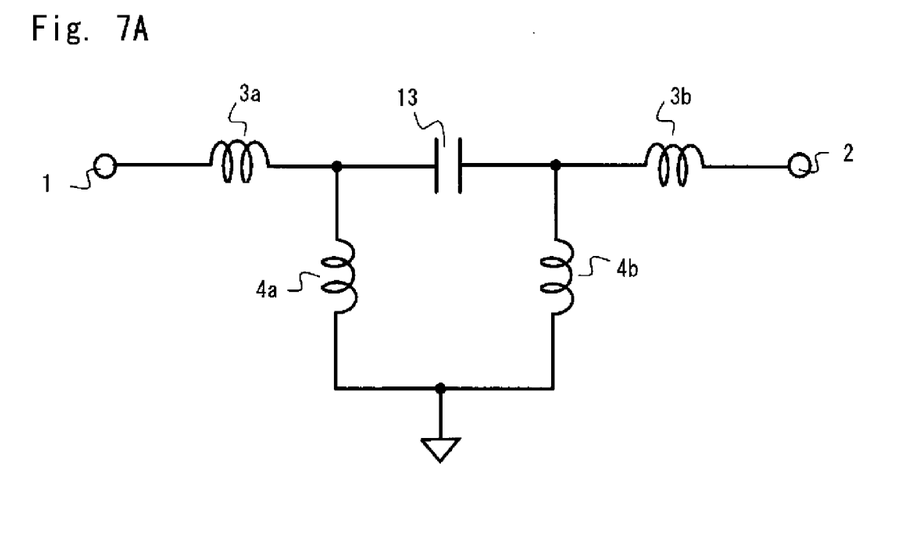
FIGS. 7A and 7B are equivalent circuit diagrams of FIG. 6 according to the first exemplary embodiment of the present invention.
Figure 7B:
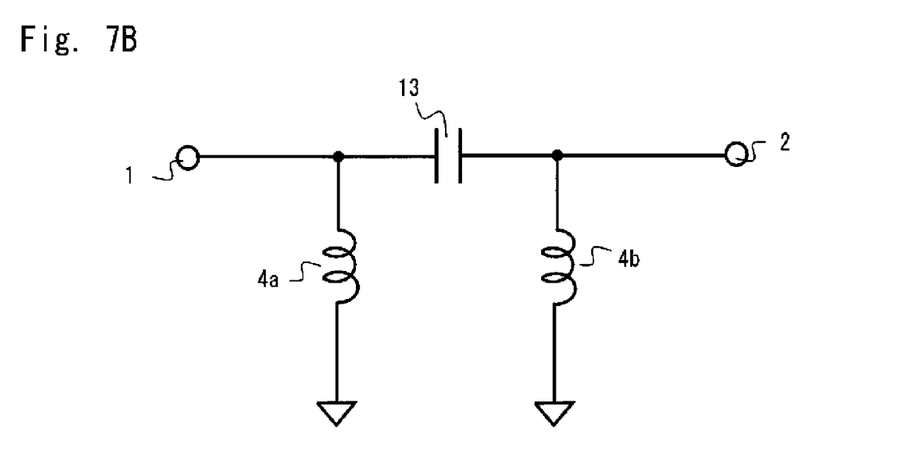
Figure 8:
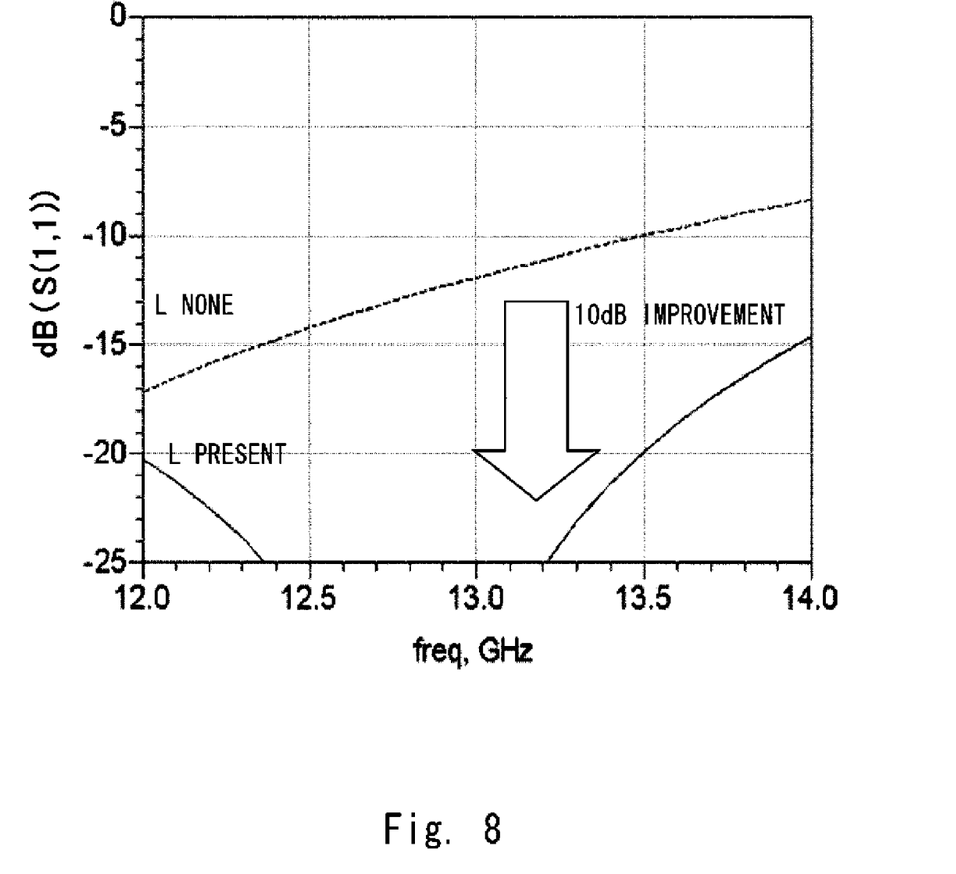
FIG. 8 is a graph showing the improvement in return loss according to the first exemplary embodiment of the present invention.
Figure 9:
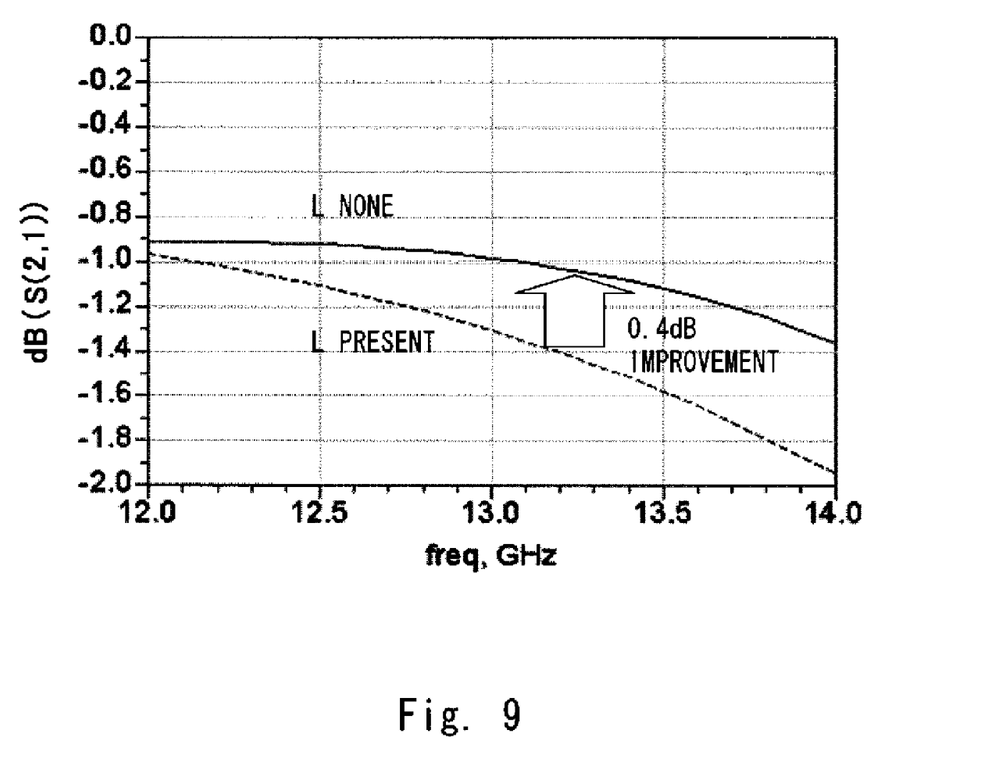
FIG. 9 is a graph showing the improvement in passage loss according to the first exemplary embodiment of the present invention.

A first exemplary embodiment of the present invention will be described below with reference to FIGS. 1 to 9. FIG. 1 is a schematic circuit diagram showing a phase shifter according to this exemplary embodiment. FIG. 2 is a schematic waveform chart showing control signals according to this exemplary embodiment. FIG. 3 is an explanatory diagram showing the relation between a selected filter and operating states of FETs according to this exemplary embodiment. FIG. 4 is a circuit diagram showing a phase shifter functioning as an LPF according to this exemplary embodiment. FIGS. 5A to 5C are equivalent circuit diagrams of FIG. 4. FIG. 6 is a circuit diagram showing a phase shifter functioning as an HPF according to this exemplary embodiment. FIGS. 7A and 7B are equivalent circuit diagrams of FIG. 6. FIG. 8 is a graph showing the improvement in return loss according to this exemplary embodiment. FIG. 9 is a graph showing the improvement in passage loss according to this exemplary embodiment. Please note that in each drawing, the same numerals are given to the same components.

As shown in FIG. 1, a phase shifter 50 includes inductors 3a and 3b, inductors 4a and 4b, an FET 5, a capacitor 6, an FET 7, and an inductor 8. The FET 7 and the inductor 8 form a resonance circuit when the FET 5 is in an on-state. Each of the inductors 4a and 4b functions as an additional line to be added to a signal line when the FET 5 is in the on-state.

The inductors 3a, 4a, 4b, and 3b are connected in this order in series between an input terminal 1 and an output terminal 2. The FET 5 bypasses the inductors 4a and 4b. In other words, the FET 5 functions as a bypass FET against the inductors 4a and 4b. The capacitor 6 is connected between the drain and source of the FET 5. The FET 7 is connected between a node between the inductors 4a and 4b and a ground. The inductor 8 is connected between the drain and source of the FET 7.

The control terminals of the FETs 5 and 7 receive complementary control voltages Φ1, Φ2 (see FIG. 2) output from the controller 60 via respective terminals 17a and 17b, and the FETs 5 and 7 operate complementarily. Specifically, when the FET 5 is in the on-state, the FET 7 is in an off-state. When the FET 7 is in the on-state, the FET 5 is in the off-state. In FIG. 2, the horizontal axis shows time (t1, t2), and complementary control voltages Φ1, Φ2 take a high level (H) and a low level (L).

"As shown in FIG. 3, the phase shifter 50 functions as the HPF or LPF (the Selected Filter) depending on the operating states of the FETs 5 and 7. The impedance of the FET which is in the on-state (ON) is equivalent to a small resistance, and the impedance of the FET which is in the off-state (OFF) is equivalent to a small capacitance."

When the FET 5 is in the on-state and the FET 7 is in the off-state, the phase shifter 50 functions as the LPF. As shown in FIG. 4, the FET 5 which is in the on-state can be replaced with a small resistance 9, and the FET 7 which is in the off-state can be replaced with an OFF capacitance 12.

When the FET 5 is in the off-state and the FET 7 is in the on-state, the phase shifter 50 functions as the HPF. As shown in FIG. 6, the FET 5 which is in the off-state can be replaced with the OFF capacitance 10 and the FET 7 which is in the on-state can be replaced with a resistance 11.

Referring to FIG. 4, consideration is given to the case where the phase shifter 50 functions as the LPF (when the FET 5 is in the on-state and the FET 7 is in the off-state).

The phase shifter 50 shown in FIG. 4 can be sequentially depicted as FIGS. 5A to 5C.

Assuming that the inductance of the inductor 8 is represented by L3 and the capacitance value of an OFF capacitance 12 is represented by Coff2, when the inductance L3 is set so as to satisfy the condition $\omega^2 \cdot L3 \cdot Coff2=1$, the inductor 8 and the FET 7 are in parallel resonance. Accordingly, the phase shifter 50 shown in FIG. 4 can be depicted as FIG. 5A.

The inductors 4a and 4b (FIG. 5A) can be equivalently replaced with open stubs 15a and 15b (FIG. 5B). If the small resistance 9 is omitted, the circuit of FIG. 5A can be replaced with the circuit of FIG. 5B.

Further, when it is used in X band, each of the two open stubs shown in FIG. 5B is equivalent to circuits where capacitance is grounded as shown in FIG. 5C. More specifically, the open stub 15a is replaced with a capacitance 16a, and the open stub 15b is replaced with a capacitance 16b.

In this case, when it is assumed that the composite capacitance (total capacitance) of the capacitances 16a and 16b, which are equivalently formed, is represented by Ceq; the inductance of the inductor 3a is represented by L1a; and the inductance of the inductor 3b is represented by L1b, the inductors 3a and 3b are connected together so as to satisfy the following conditions for the Ceq, L1a, and L1b. As a result, a matched LPF can be formed.

$$L1a=L1b, Bn=2Xn/(1+Xn^2)$$

where Bn represents an admittance due to the Ceq of the two capacitances, and Xn represents an impedance due to the L1a.

For example, when a 45-degree phase shifter operating at 12 GHz is designed using a GaAs substrate having a dielectric constant of about 13 and a thickness of 50μ as a semiconductor substrate, the Ceq is in the range from 0.1 to 0.3 PF. In this case, the inductor 3a having an inductance of about 0.1 to 0.3 nH is inserted to obtain the matched LPF.

Referring now to FIG. 6, consideration is given to the case where the phase shifter 50 functions as the HPF (when the FET 5 is in the off-state and the FET 7 is in the on-state.

Provided that the resistance 11 is ignored because of its small resistance, and further provided that the composite capacitance of the OFF capacitance 10 and the capacitor 6 is represented by a capacitance 13, the phase shifter 50 shown in FIG. 6 can be depicted as FIG. 7A.

The inductors 3a and 3b have little influence on the characteristics of the HPF, because the relation between the inductance L1a of the inductor 3a and the inductance L2a of the inductor 4a satisfies L1a<L2a. This holds true to a relationship between the inductors 3b and 4b. Accordingly, FIG. 7A can also be depicted as FIG. 7B.

In this First exemplary embodiment described with reference to FIGS. 1 to 9, the inductor 3a is inserted between the input terminal 1 and the inductor 4a and the inductor 3b is inserted between the inductor 4b and the output terminal 2 so that the inductors 3a and 3b correspond to the open stubs and 15b that are coupled to the signal line when the phase shifter 50 functions as the LPF. As a result, when the phase shifter 50 functions as the LPF, the matched LPF can be formed unlike the case where the inductors 3a and 3b are not inserted. Accordingly, it is possible to prevent degradation in return loss which is caused when the FET 5 connected in series with the signal line is in the on-state and the FET 7 connected in parallel with the signal line is in the off-state. Moreover, an increase in passage loss can be suppressed.

"Referring next to FIG. 8, consideration is given to the result of comparison between the case where the inductors 3a and 3b are inserted in the 45-degree phase shifter which is designed to operate at 12 GHz and the case where the inductors 3a and 3b are not inserted therein. As the characteristics of the phase shifter 50 when the FET 5 in the on-state, FIG. 8 shows the improvement in return loss, and FIG. 9 shows the improvement in passage loss. In FIGS. 8 and 9, the horizontal axis shows frequency (GHz) and the vertical axis shows dB(S(1,1)) and dB(S(2,1)), respectively. "L PRESENT" shown in FIGS. 8 and 9 indicates the case where the inductors 3a and 3b are inserted in the phase shifter, and "L NONE" shown in FIGS. 8 and 9 indicates the case where the inductors 3a and 3b are not inserted in the phase shifter. As obvious from FIGS. 8 and 9, according to this exemplary embodiment, an improvement in return loss of about 10 dB was obtained as depicted in FIG. 8, and an improvement in passage loss of about 0.4 dB was obtained as depicted in FIG. 9. The substantially same result was obtained in a prototype of this exemplary embodiment."

Note that the present invention can also be applied to a multi-bit phase shifter which includes single-bit phase shifters connected to each other. In the multi-bit phase shifter, a deviation in impedance between the single-bit phase shifters is added. As a result, the degree of degradation in return loss of the entire circuit may be greater than that of each of the single-bit phase shifters. When the present invention is applied to the multi-bit phase shifter, a drastic improvement can be achieved in the entire phase shifter.

Note that the phase shifter disclosed in Patent Document 1 is a circuit functioning as the HPF when the FET connected in series with the signal line is in the on-state, and functioning as the LPF when the FET is in the off-state. Meanwhile, the phase shifter according to this exemplary embodiment is a circuit functioning as the LPF when the FET connected in series with the signal line is in the on-state, and functioning as the HPF when the FET is in the off-state. Accordingly, the circuit configuration of the phase shifter disclosed in Patent Document 1 differs from that of the phase shifter according to this exemplary embodiment.

The technical scope of the present invention is not limited to the above exemplary embodiments. The specific circuit configuration may be arbitrarily selected to form the phase shifter.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A phase shifter comprising:
    a first field-effect transistor having a source thereof coupled to a first node, a drain thereof coupled to a second node, and a gate thereof coupled to a control terminal;
    a first additional line coupled between the first node and a third node;
    a second additional line coupled between the second node and the third node;
    a parallel resonator coupled between the third node and a signal ground;
    a first inductor coupled between a first input/output terminal and the first node; and
    a second inductor coupled between a second input/output terminal and the second node.

2. The phase shifter according to claim 1, wherein the parallel resonator comprises:
    a second field-effect transistor coupled between the third node and the signal ground; and
    a third inductor coupled between the third node and the signal ground.

3. The phase shifter according to claim 2, wherein the parallel resonator is configured to resonate at a predetermined frequency when the second field-effect transistor is in an OFF state.

4. The phase shifter according to claim 3, further comprising a controller coupled to the control terminal to turn on the first field-effect transistor when the second field-effect transistor is in an OFF state.

5. The phase shifter according to claim 4, wherein the first and the second inductors are configured to perform a low pass filter with the first and the second additional lines when the second field-effect transistor is in the OFF state.

6. The phase shifter according to claim 3,
    wherein the first field-effect transistor and the second field-effect transistor receive complementary control signals.

7. The phase shifter according to claim 1, wherein each of the first and the second additional lines is an inductor.

* * * * *